United States Patent
Chen et al.

(10) Patent No.: US 11,609,662 B1
(45) Date of Patent: Mar. 21, 2023

(54) TOUCH DETECTION METHOD AND TOUCH AND DISPLAY DRIVING CIRCUIT THEREOF

(71) Applicant: NOVATEK Microelectronics Corp., Hsin-Chu (TW)

(72) Inventors: Hung-Hsiang Chen, Hsinchu (TW); Huang-Chin Tang, Hsinchu County (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 17/747,992

(22) Filed: May 18, 2022

(51) Int. Cl.
*G06F 3/041* (2006.01)
*H01L 27/32* (2006.01)

(52) U.S. Cl.
CPC ........ *G06F 3/04184* (2019.05); *G06F 3/0412* (2013.01); *H01L 27/323* (2013.01)

(58) Field of Classification Search
CPC ...... G06F 3/041–047; G06F 2203/041–04114; G06F 3/04184; G06F 3/04182; G06F 3/04166; G06F 3/0416; G06F 3/0488; G06F 1/1643; H01L 27/323
See application file for complete search history.

(56) References Cited

U.S. PATENT DOCUMENTS

| | | | |
|---|---|---|---|
| 2014/0210775 A1* | 7/2014 | Ota | G06F 3/04184 345/173 |
| 2019/0279600 A1* | 9/2019 | Chan | G06F 3/04166 |
| 2021/0089188 A1* | 3/2021 | Lin | G09G 3/20 |

* cited by examiner

*Primary Examiner* — Sanjiv D. Patel
(74) *Attorney, Agent, or Firm* — Winston Hsu

(57) ABSTRACT

A touch detection method for a touch and display driving circuit includes transmitting a first touch pulse signal of a first frame and transmitting a first touch pulse signal of a second frame. A start timing of the first touch pulse signal of the first frame with respect to the first frame is different from a start timing of the first touch pulse signal of the second frame with respect to the second frame.

6 Claims, 4 Drawing Sheets

TOUCH DETECTION METHOD AND TOUCH AND DISPLAY DRIVING CIRCUIT THEREOF

BACKGROUND OF THE INVENTION

1. Field of the Invention

The present invention relates to a touch detection method and a touch and display driving circuit thereof, and more particularly, to a touch detection method and a touch and display driving circuit thereof to improve display quality.

2. Description of the Prior Art

FIG. 1 is a timing diagram of a touch signal Tx1. In FIG. 1, a vertical sync signal Vsync is used to indicate a start (or an end) timing of a frame. Each frame is divided into blank periods BP, FP and a display term. The touch signal Tx1 may include touch pulse signals occurring in touch terms TP1-TP3 of frames F1-F4. The timings of the touch terms TP1-TP3 (and the timings of the touch pulse signals in the touch terms) are fixed in the frames F1-F4.

FIG. 2 is a schematic diagram of a part of a display panel 20. A touch pulse signal of the touch signal Tx1 is configured to drive one or more touch sensors 200TS of the display panel 20 during touch detection operation.

When the touch detection operation is performed in a touch term of a frame, the touch detection operation may interfere with display operation in a display term of the frame. Specifically, the voltage variation of the touch sensor 200TS during the touch detection operation ripples/affects the voltage of a cathode 200C of the display panel 20 due to a parasitic capacitor 200PC1 between the touch sensor 200TS and the cathode 200C. The disturbed voltage of the cathode 200C then impacts the voltage of an anode 200N of the display panel 20 through a parasitic capacitor 200PC2 between the cathode 200C and the anode 200N. Since the voltage applied across the cathode 200C and the anode 200N determines the intensity of light emitted from an organic layer 200G of the display panel 20, the electrical interference issues resulted from the touch sensor 200TS make certain organic light-emitting diode(s) (OLED) 200D of the display panel 20 brighter/darker, which results in abnormal display line(s) on the display panel 20.

As shown in FIG. 1, the timings of the touch terms TP1 in the frames F1-F4 (and the timings of the touch pulse signals in the touch terms) are the same with respect to their corresponding frames; therefore, the abnormal display line(s) caused by the touch pulse signals of the touch signal Tx1 may be fixed to certain position(s) (namely, certain display line(s), each of which corresponds to a gate line and includes pixels aligned in row(s)) on the display panel 20. Particularly, since the luminance efficacy is calculated by temporal integration of human eyes, the abnormal display line(s) is/are enhanced in the position(s) after many frames. It becomes easier for the human eyes to perceive the abnormal display line(s). This can decrease display quality.

SUMMARY OF THE INVENTION

It is therefore a primary objective of the present application to provide a touch detection method and a touch and display driving circuit thereof to improve over disadvantages and/or restrictions of the prior art.

An embodiment of the present invention provides a touch detection method, for a touch and display driving circuit, comprising transmitting a first touch pulse signal of a first frame; and transmitting a first touch pulse signal of a second frame, wherein a start timing of the first touch pulse signal of the first frame with respect to the first frame is different from a start timing of the first touch pulse signal of the second frame with respect to the second frame.

An embodiment of the present invention provides a touch and display driving circuit, comprising a touch circuit, configured to transmit a first touch pulse signal of a first frame and transmit a first touch pulse signal of a second frame, wherein a start timing of the first touch pulse signal of the first frame with respect to the first frame is different from a start timing of the first touch pulse signal of the second frame with respect to the second frame.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
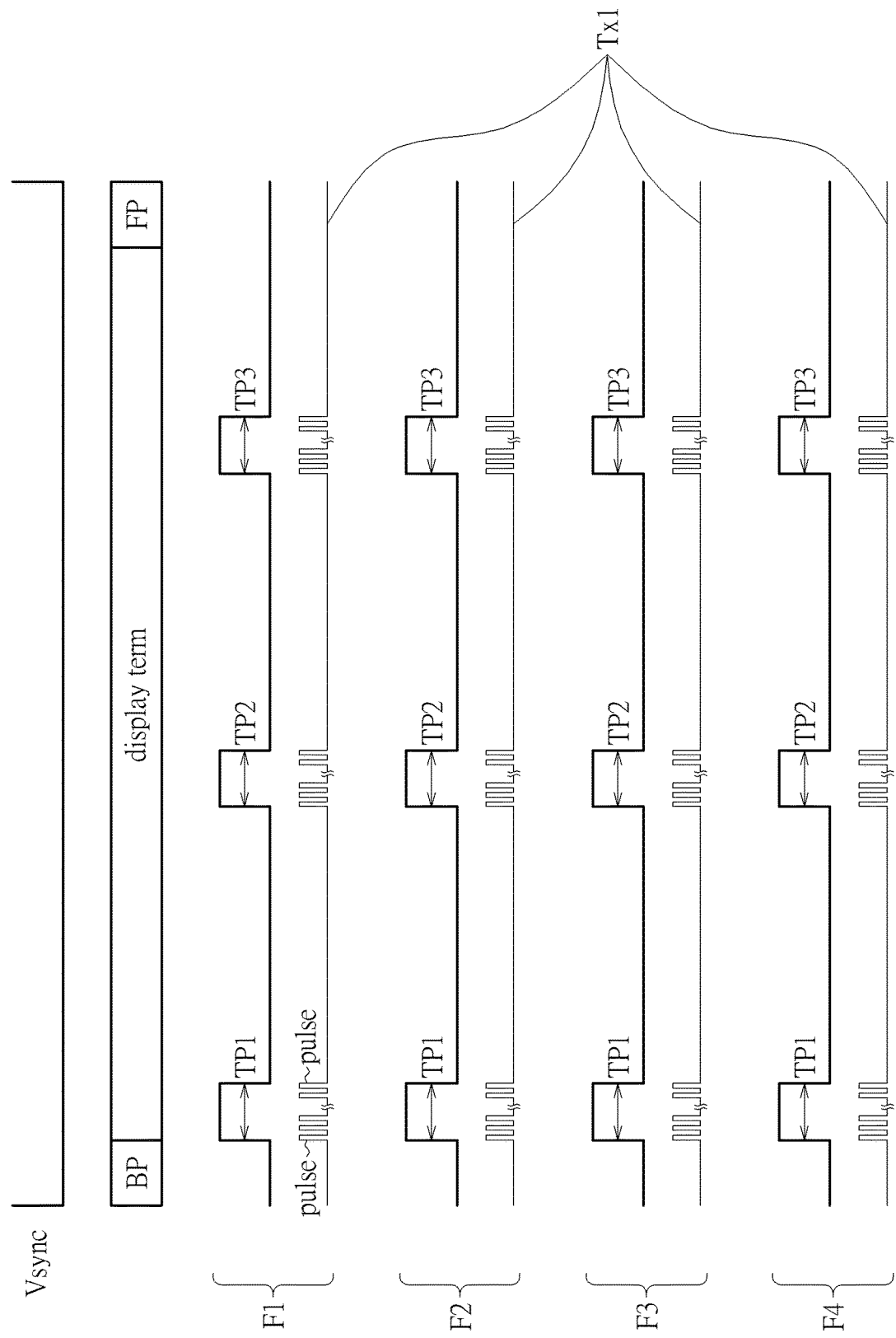
FIG. 1 is a timing diagram of a touch signal.
Figure 2:
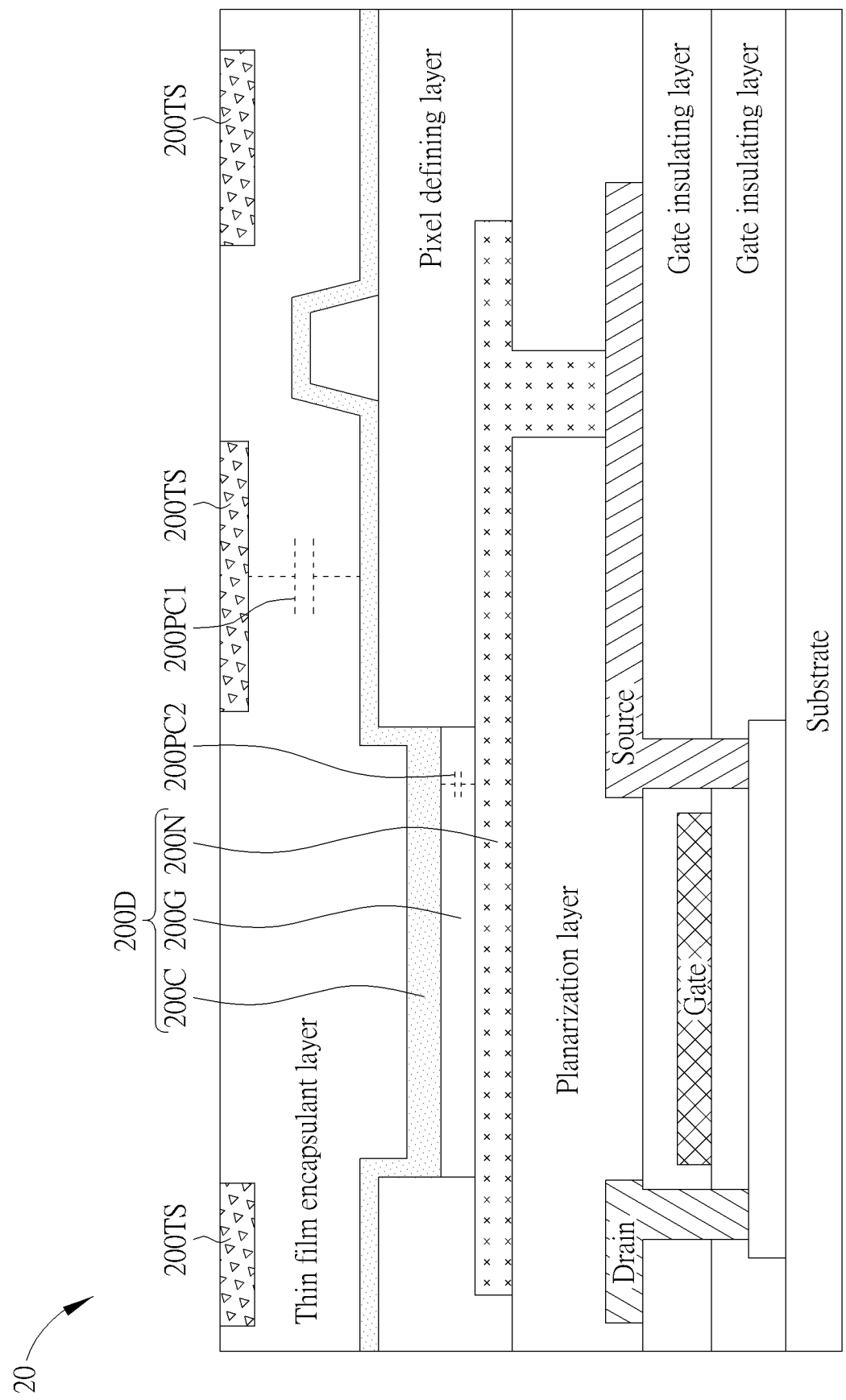
FIG. 2 is a schematic diagram of a part of a display panel.
Figure 3:
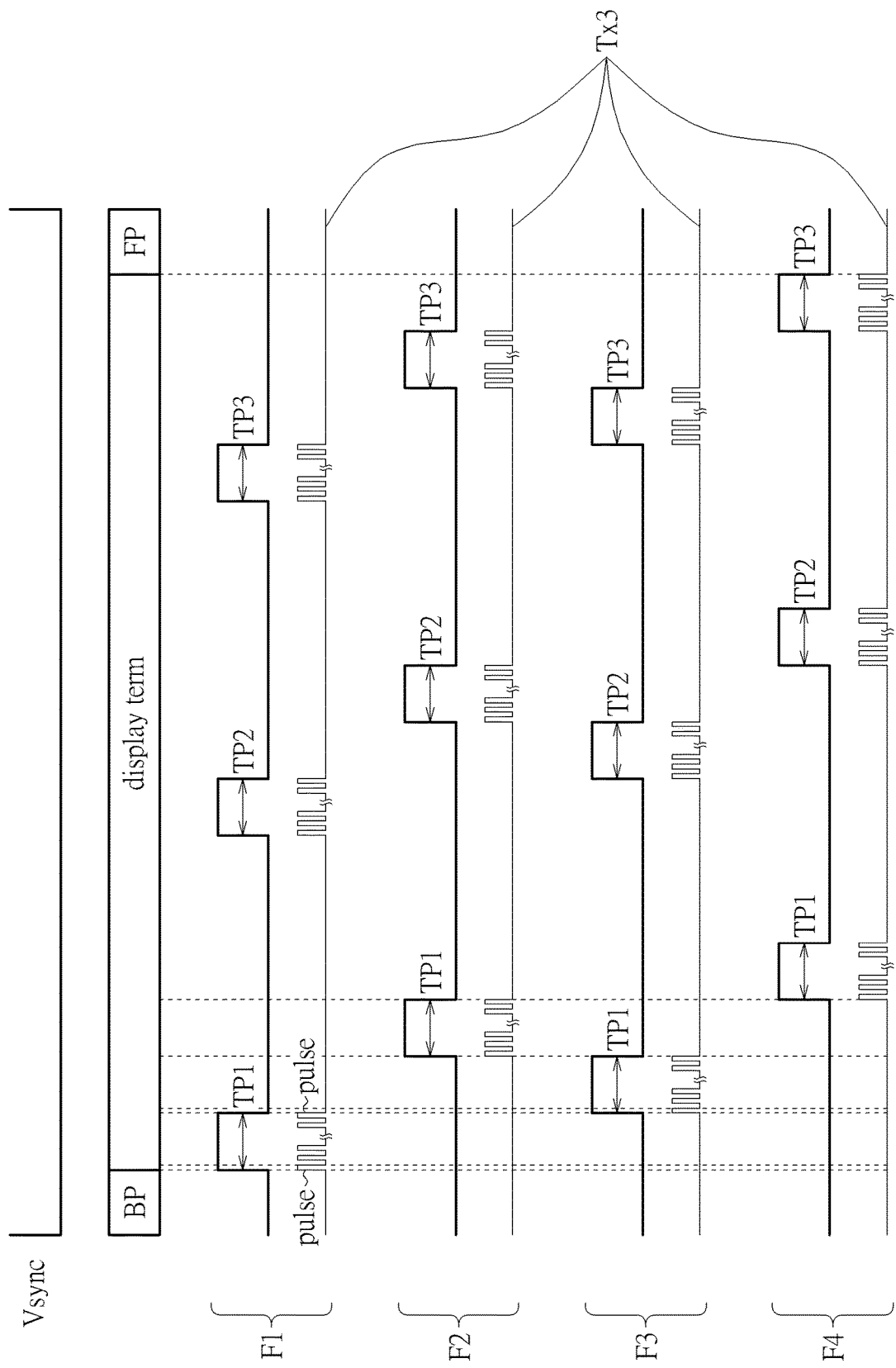
FIG. 3 and FIG. 4 are timing diagrams of touch signals according to examples of the present invention respectively.

FIG. 3 is a timing diagram of a touch signal Tx3 according to an example of the present invention. A touch circuit may output the touch signal Tx3 toward a display panel in touch terms TP1-TP3 of a frame F1, touch terms TP1-TP3 of a frame F2 . . . and touch terms TP1-TP3 of a frame F4. The touch signal Tx3 may include touch pulse signals occurring in the touch term TP1 of the frame F1 (to drive touch sensors of the display panel one time) . . . and touch pulse signals occurring in the touch term TP3 of the frame F4 (to drive the touch sensors of the display panel one time), where n is an integer.

The timings of touch terms change from frame to frame: For example, the (start) timing of the touch term TP1 of the frame F1 with respect to the frame F1 is different from the (start) timing of the touch term TP1 of the frame F2 with respect to the frame F2.

The different timings of touch terms in different frames may improve display quality: By dynamically changing the timings of touch terms in different frames, the touch terms may respectively overlap/coincide with different display term timeslots each corresponding to different display line(s) on the display panel. When the touch detection operation is performed, the touch detection operation may have an influence on display operation if the display operation and the touch detection operation are operated simultaneously. As a result, abnormal display line(s) may appear on the display panel. However, the touch signal Tx3 may interfere different display line(s) in different frames as the timings of the touch terms vary from frame to frame. As a result, human eyes, where the luminance efficacy of a pixel is calculated by (temporal) integration, may not notice/discriminate the (barely-perceptible) abnormal display line(s), and display quality increases.

Since the timings of touch terms change from frame to frame, the timing of a touch pulse signal occurring in a frame differs from the timing of any touch pulse signal occurring in another frame. For example, the (start) timing of the first touch pulse signal of the frame F1 with respect to the frame F1 is different from the (start) timing of the first touch pulse signal of the frame F2 with respect to the frame F2. In other words, the timings of the touch terms (e.g., the touch terms TP1 in the frames F1-F4) are inconsistent/unfixed in the frames F1-F4, and so are the timings of the touch pulse signals (e.g., the first touch pulse signals in the frames F1-F4).

In FIG. 3, a touch term (e.g., the touch term TP1) defines a length of time for touch detection operation. Voltage changes with respect to time (i.e., the thin solid lines in FIG. 3) indicate that the touch signal Tx3 includes touch pulse signals.

The (start) timings of certain touch terms with respect to corresponding frames may be regular, partially regular, or irregular/random: In one embodiment, the start timings of touch terms of different frames (e.g., the touch terms TP1 in the frames F1-F4) may increase (or decrease in another embodiment) frame by frame with respect to their frames respectively. For example, the touch terms in the same occurrence order but different frames (e.g., the touch terms TP1 in the frames F1-F4) may shift gradually.

In FIG. 3, although the timings of the touch terms are inconsistent/unfixed, the timing of a touch pulse signal (in an occurrence order) with respect to its touch term is the same as the timing of another touch pulse signal (in the same occurrence order) with respect to its touch term. For example, the end timing of the last touch pulse signal in the touch term TP1 of the frame F1 coincides with the end timing of the touch term TP1 of the frame F1, and the end timing of the last touch pulse signal in the touch term TP1 of the frame F2 coincides with the end timing of the touch term TP1 of the frame F2.

Figure 4:
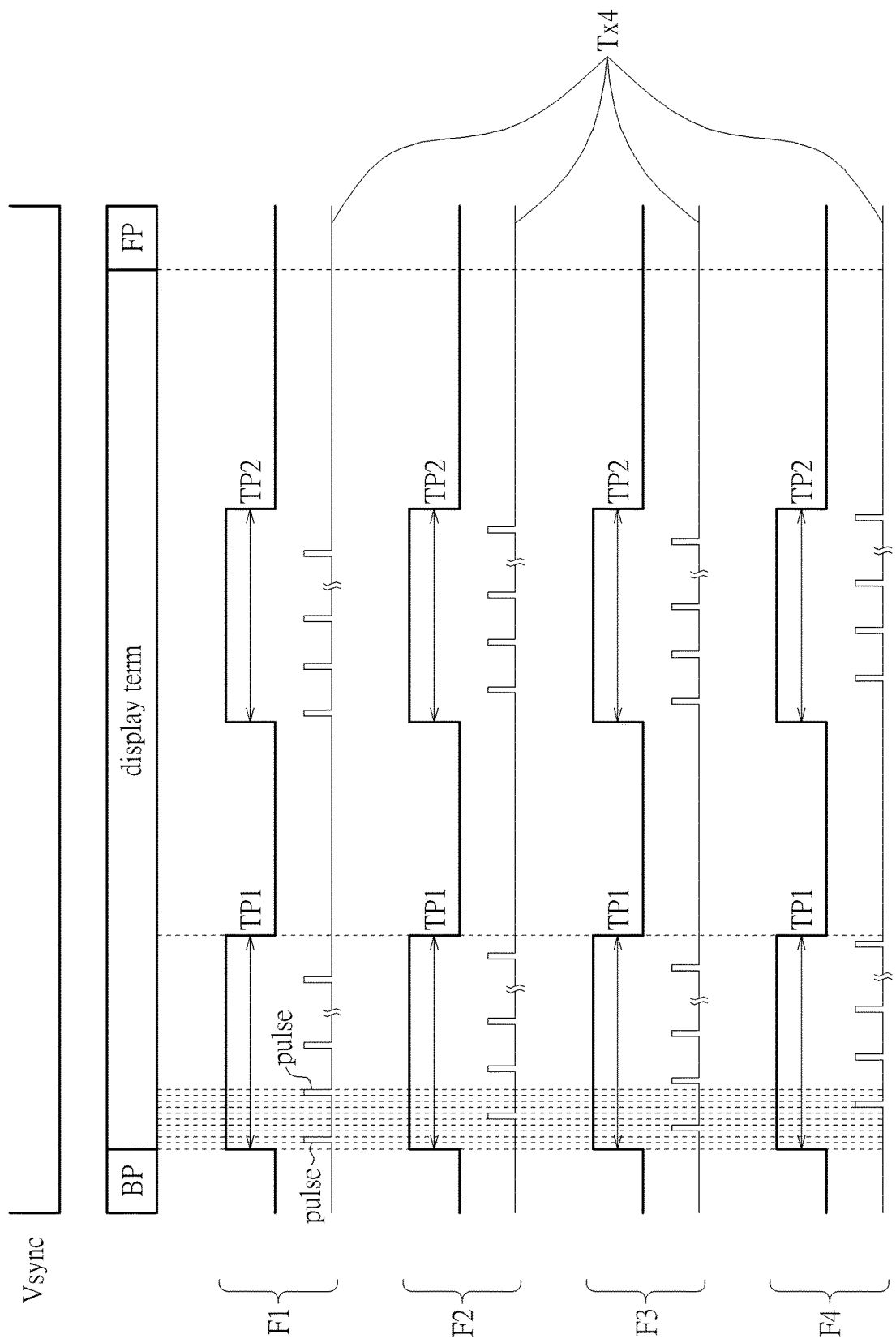

FIG. 4 is a timing diagram of a touch signal Tx4 according to an example of the present invention. As shown in FIG. 4, the touch signal Tx4 may include touch pulse signals occurring in touch terms TP1-TP2 of frames F1-F4.

The timings of the touch terms TP1 in the frames F1-F4 are the same/consistent/fixed with respect to their corresponding frames. On the other hand, the timings of touch pulse signals are different: For example, the (start) timing of the first touch pulse signal in the touch term TP1 of the frame F1 with respect to the touch term TP1 of the frame F1 is different from the (start) timing of the first touch pulse signal in the touch term TP1 of the frame F2 with respect to the touch term TP1 of the frame F2. That is, the timings of touch pulse signals are dynamically changed in the touch terms of the fixed timing with respect to their frame.

As a result, the touch signal Tx4 may interfere different display lines, each of which includes pixels aligned in row(s), in different frames (for instance, the first touch pulse signal in the frame F1 may disturb the luminance of certain pixel(s), which differ/differs from the pixel(s) affected by the first touch pulse signal in the frame F2) as the timings of touch pulse signals changes from frame to frame, thereby improving display quality.

Like the timings of touch terms, the timings of certain touch pulse signals with respect to corresponding touch terms may be regular, partially regular, or irregular.

In an embodiment, the touch circuit may include a counter, which sets the time difference between the start timing of a touch pulse signal (or the start timing of a touch term) and the start timing of its frame or touch term to make the timings of the touch pulse signal (or the timing of the touch term) with respect to its frame or touch term regular, partially regular, or irregular/random.

In FIG. 3 and FIG. 4, the display operation and the touch detection operation are operated simultaneously instead of in a time-division manner. During a display term, which occurs after a blank period BP and before a blank period FP in a frame, a gate driver drives gate lines of the display panel one after another to light up pixels of the display panel row by row. During the display term, the touch circuit outputs touch signal(s) (e.g., the touch signal Tx3) toward the display panel to scan touch sensors of the display panel. That is, touch pulse signals for touch detection operation is transmitted during a display term for display operation.

In FIG. 3 and FIG. 4, all the touch sensors of the display panel are scanned/driven in sequence one time in one touch term (e.g., the touch term TP1). There is at least one touch term in one frame, meaning that all the touch sensors of the display panel are scanned/driven at least one time in one frame. A touch report rate of the display panel is associated to how many touch terms there is in one frame. The touch report rate in FIG. 3 is three times as much as the display frame rate as FIG. 3 shows three touch terms in one frame. The touch report rate in FIG. 4 is two times as much as the display frame rate as FIG. 4 shows two touch terms in one frame.

Different technical features described in the following embodiments (e.g., those shown in FIG. 3 and FIG. 4) may be mixed or combined in various ways if they are not conflict to each other.

A touch and display driving circuit (TDDI) may include the touch circuit configured to detect electrical change of touch sensor(s) on the display panel for touch detection operation and a display driver configured to drive the display panel for display operation. The touch circuit and the display driver may be fabricated into one single semiconductor chip, while a region in which the touch circuit is located may be separated apart from a region in which the display driver is located. The operation of the display driver and the operation of the touch circuit are synchronized with each other (according to, for example, a vertical sync signal Vsync).

The TDDI may receive a video packet stream from a front stage circuit (which is, for example, a processor or a host controller) via a transmission interface (e.g., a mobile industry processor interface (MIPI)). The TDDI may include a timing controller, a source driver, a gate driver, and the touch circuit. The timing controller may receive the video packet stream to send signals (e.g., the vertical sync signal Vsync) to the source driver and the gate driver, such that the source driver may drive data line(s) of the display panel and the gate driver may drive gate line(s) of the display panel for display operation. The timing controller also controls the touch circuit, and thus the touch circuit may transmit a touch signal to drive touch sensor(s) of the display panel during touch detection operation. The touch circuit may drive touch sensor(s) when the gate driver is driving gate line(s).

The touch circuit may be connected to a display driver integration circuit (DDI). A sync signal generator may output sync signal(s) to ensure the touch circuit to drive touch sensor(s) of the display panel at the right time during touch detection operation. The sync signal generator may be a controller of the DDI or generate the sync signal(s) according to the controller of the DDI. The touch circuit may drive the touch sensor(s) when a gate driver of the DDI is driving gate line(s).

The display panel may be an OLED panel.

To sum up, the present invention adopts dynamic touch scanning. The timings of touch pulse signals of a touch signal are dynamically changed from frame to frame and correspond to the timings of the display operation of different display lines. In other words, the timing of a touch pulse signal is related to which frame the touch pulse signal corresponds to (namely, in a time-wise or time-distributed manner) and which display line(s) the touch pulse signal corresponds to (namely, in a position-wise or spatial-dislocated manner). Because of the time-distributed and spatial-dislocated manner, the abnormal display line(s) caused by the touch pulse signals of the touch signal may appear in different positions of the display panel in different (display) frames and look indiscernible against other display lines to human eyes.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A touch detection method, for a touch and display driving circuit, comprising:
   transmitting a first touch pulse signal of a first frame; and
   transmitting a first touch pulse signal of a second frame,
      wherein a start timing of the first touch pulse signal of the first frame with respect to the first frame is different from a start timing of the first touch pulse signal of the second frame with respect to the second frame, one of a plurality of touch terms of a frame comprises a plurality of touch pulse signals, and a start timing of a first touch term of the first frame with respect to the first frame is same as a start timing of a first touch term of the second frame with respect to the second frame.

2. The touch detection method of claim 1, wherein a display operation and a touch detection operation are operated simultaneously.

3. The touch detection method of claim 1, wherein the touch and display driving circuit is capable of driving an organic light-emitting diode panel.

4. A touch and display driving circuit, comprising:
   a touch circuit, configured to transmit a first touch pulse signal of a first frame and transmit a first touch pulse signal of a second frame, wherein a start timing of the first touch pulse signal of the first frame with respect to the first frame is different from a start timing of the first touch pulse signal of the second frame with respect to the second frame, one of a plurality of touch terms of a frame comprises a plurality of touch pulse signals, and a start timing of a first touch term of the first frame with respect to the first frame is same as a start timing of a first touch term of the second frame with respect to the second frame.

5. The touch and display driving circuit of claim 4, wherein the touch and display driving circuit is capable of driving an organic light-emitting diode panel.

6. The touch detection method of claim 1, wherein start timings of the plurality of touch pulse signals with respect to the plurality of touch terms are partially regular or irregular.

* * * * *